(12) United States Patent
Marakhtanov et al.

(10) Patent No.: US 9,245,720 B2
(45) Date of Patent: Jan. 26, 2016

(54) METHODS AND APPARATUS FOR DETECTING AZIMUTHAL NON-UNIFORMITY IN A PLASMA PROCESSING SYSTEM

(75) Inventors: Alexei Marakhtanov, Albany, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 538 days.

(21) Appl. No.: 13/494,456

(22) Filed: Jun. 12, 2012

(65) Prior Publication Data
US 2013/0327481 A1 Dec. 12, 2013

(51) Int. Cl.
*H01L 21/00* (2006.01)
*H01J 37/32* (2006.01)
*G01R 19/00* (2006.01)
*G01R 29/08* (2006.01)

(52) U.S. Cl.
CPC ..... *H01J 37/32935* (2013.01); *H01J 37/32091* (2013.01); *H01J 37/3299* (2013.01); *H01J 37/32174* (2013.01); *H01J 37/32577* (2013.01); *G01R 19/0061* (2013.01); *G01R 29/0878* (2013.01)

(58) Field of Classification Search
CPC ............ H01J 37/32917; H01J 37/3299; H01J 37/32577; G01R 19/0061
See application file for complete search history.

(56) References Cited

U.S. PATENT DOCUMENTS

| | | | |
|---|---|---|---|
| 2008/0116876 A1* | 5/2008 | White et al. | 324/76.11 |
| 2008/0187682 A1* | 8/2008 | Park et al. | 427/569 |
| 2008/0274297 A1* | 11/2008 | Furuta et al. | 427/569 |
| 2009/0151871 A1* | 6/2009 | Pease et al. | 156/345.28 |
| 2010/0089319 A1* | 4/2010 | Sorensen et al. | 118/723 E |
| 2010/0136261 A1* | 6/2010 | Tso et al. | 427/569 |
| 2010/0196626 A1* | 8/2010 | Choi et al. | 427/569 |
| 2013/0127124 A1* | 5/2013 | Nam et al. | 279/128 |
| 2013/0128409 A1* | 5/2013 | Nam et al. | 361/234 |
| 2013/0240145 A1* | 9/2013 | Nam et al. | 156/345.28 |
| 2013/0240147 A1* | 9/2013 | Nam et al. | 156/345.46 |
| 2013/0240482 A1* | 9/2013 | Nam et al. | 216/59 |

\* cited by examiner

*Primary Examiner* — Sylvia R MacArthur
*Assistant Examiner* — Anna Crowell
(74) *Attorney, Agent, or Firm* — Martine Penilla Group, LLP

(57) ABSTRACT

Apparatus and methods for assessing RF return current azimuthal uniformity are disclosed. A plurality of non-linear substantially-enclosed RF current sensors are disposed azimuthally around a central axis of a plasma processing chamber. When a plasma is ignited in the plasma processing chamber, the RF return currents are sensed in the plurality of non-linear substantially-enclosed RF current sensors and analyzed to ascertain whether RF return current azimuthal uniformity is acceptable.

10 Claims, 8 Drawing Sheets

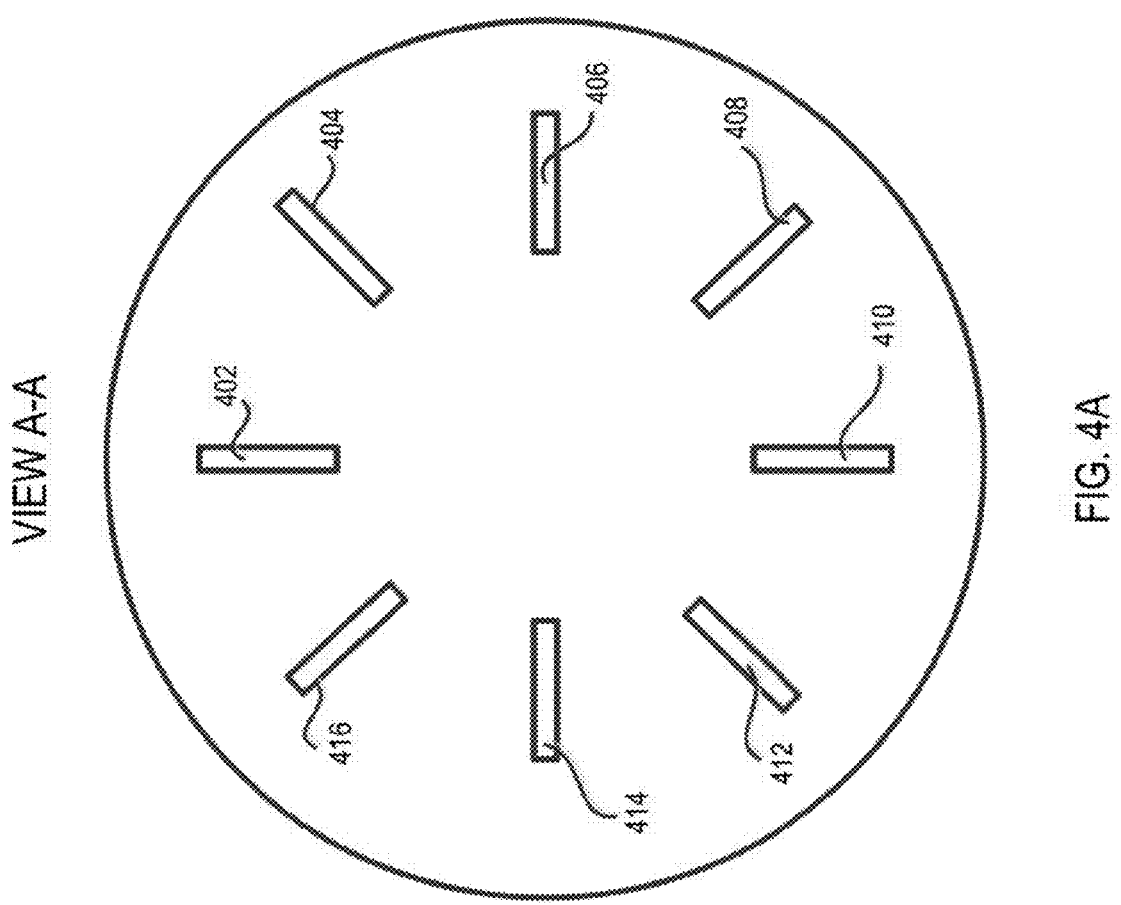

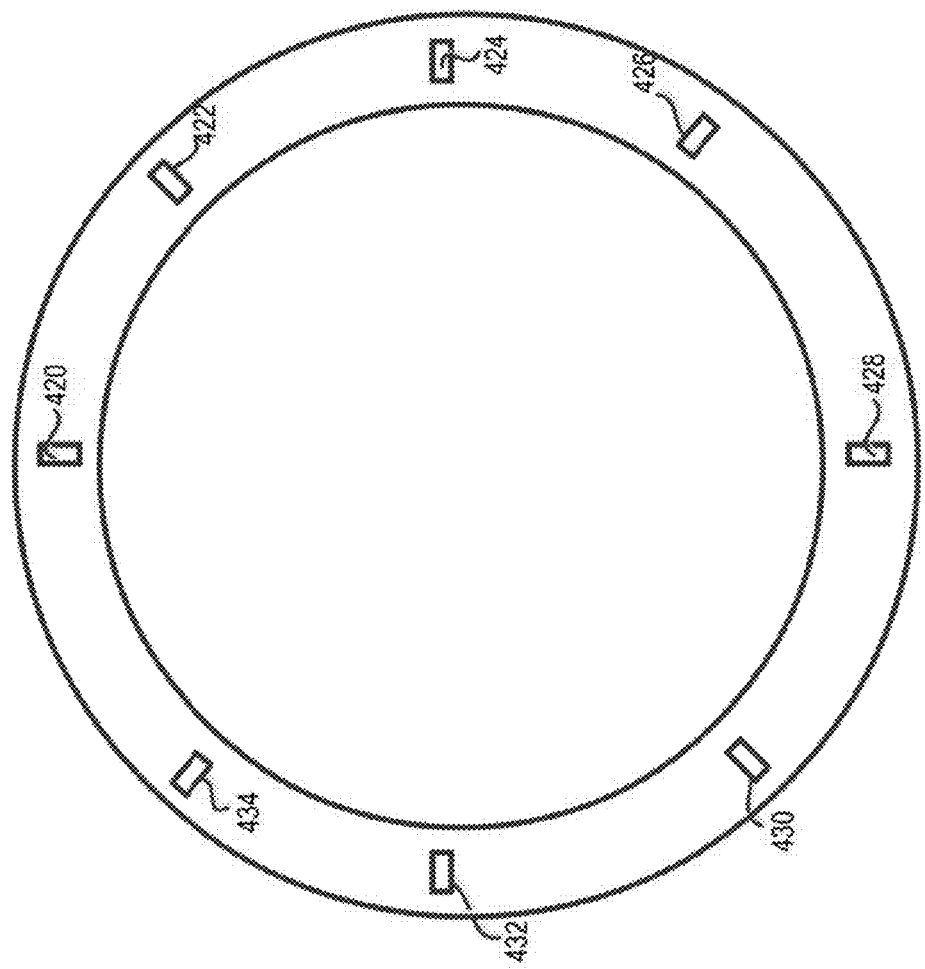

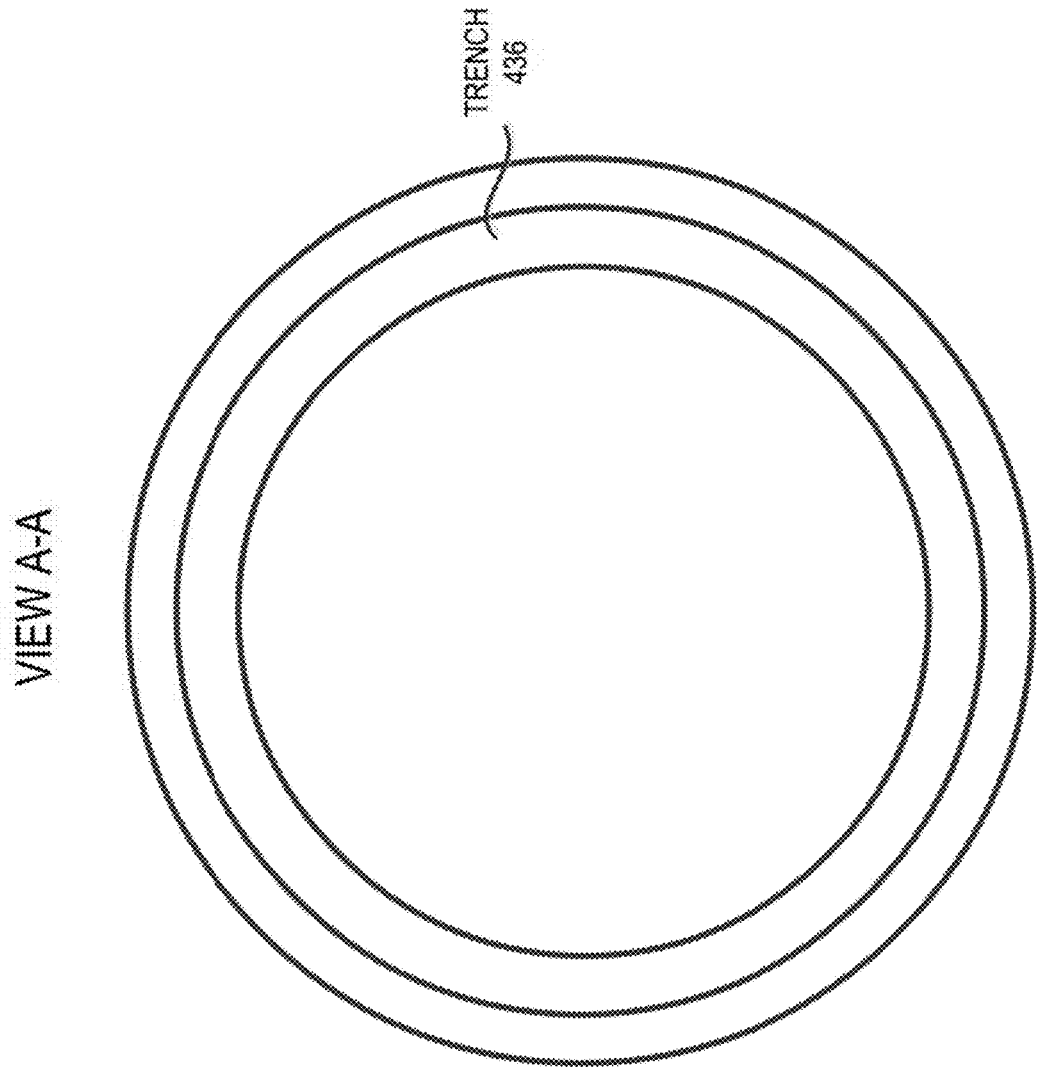

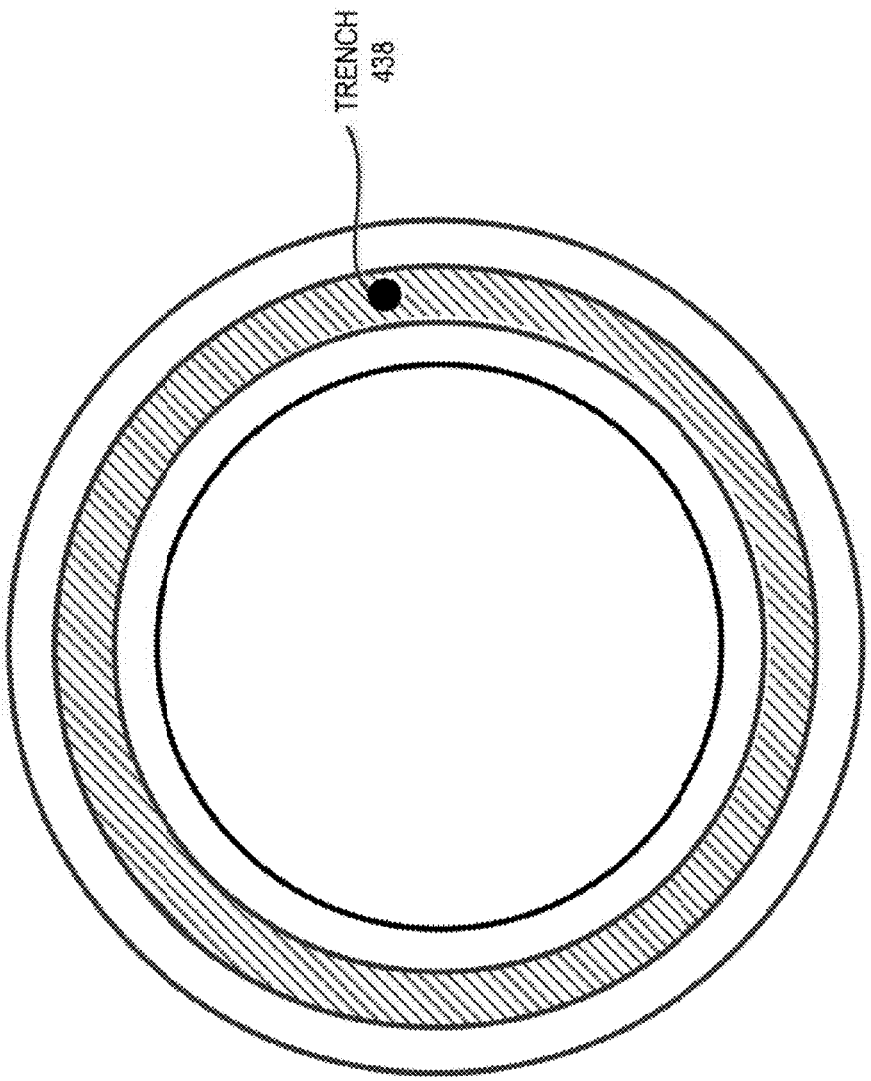

METHODS AND APPARATUS FOR DETECTING AZIMUTHAL NON-UNIFORMITY IN A PLASMA PROCESSING SYSTEM

BACKGROUND OF THE INVENTION

Plasma has long been employed to process substrates, including for example semiconductor wafers for integrated circuit fabrication and panels for liquid crystal display fabrication. As technology improves and more and more devices are packaged into a smaller area of the substrate, it is critical that the processing precisely forms these devices and minimizes defects.

A critical parameter for plasma processing of substrates nowadays is azimuthal uniformity. Azimuthal uniformity refers to the uniformity of devices or features formed around the wafer. For example, given a certain reference angle on a wafer, it is desirable that the devices formed at a 45-degree position from that reference angle be essentially the same as the devices formed at 135 degrees, 180 degrees, or 210 degrees from that reference angle.

Azimuthal uniformity is especially challenging in some modern plasma processing chambers because of the non-symmetry of some components within the chamber. For example, in some chambers, the lower electrode assembly is supported by a cantilever arm. With this arrangement, the RF return current is asymmetric due to the presence of the cantilever arm in one part of the chamber.

The cantilever arm also affects azimuthal non-uniformity in other ways. For example, exhaust gas has to flow around the cantilever arm as it is pumped from the plasma generating region to the exhaust port, which is typically located at the bottom of the chamber. The non-uniformity of the gas flow due to the presence of the cantilever arm affects pressure uniformity in the azimuthal direction, which in turn affects the plasma density in the azimuthal direction, thereby affecting process uniformity in the azimuthal direction.

As another example, certain components may be placed in certain locations around the chamber but not at others. For example, an OES (optical emission spectroscopy) port may exist in one location of the chamber liner but not in another. The presence of such non-symmetric components introduces azimuthal non-uniformity with respect to the RF current return path(s), which may result in non-uniform processing around the wafer in the azimuthal direction.

As modern processing requirements become more stringent, many customers have specified that azimuthal uniformity be below, for example, one percent or even lower. Accordingly, there is a need to monitor the azimuthal non-uniformity for development and processing purposes.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4A shows, in accordance with an embodiment of the invention, a plurality of RF sensor trenches machined or disposed in a horizontal chamber component.

FIG. 4B shows, in accordance with an embodiment of the invention, a plurality of RF sensor trenches machined from, for example, a chamber liner.

FIG. 4C shows, in accordance with an embodiment of the invention, a trench machined or disposed in a horizontal chamber component.

FIG. 4D shows, in accordance with an embodiment of the invention, a trench machined from, for example, a chamber liner.

DETAILED DESCRIPTION OF EMBODIMENTS

Figure 1:
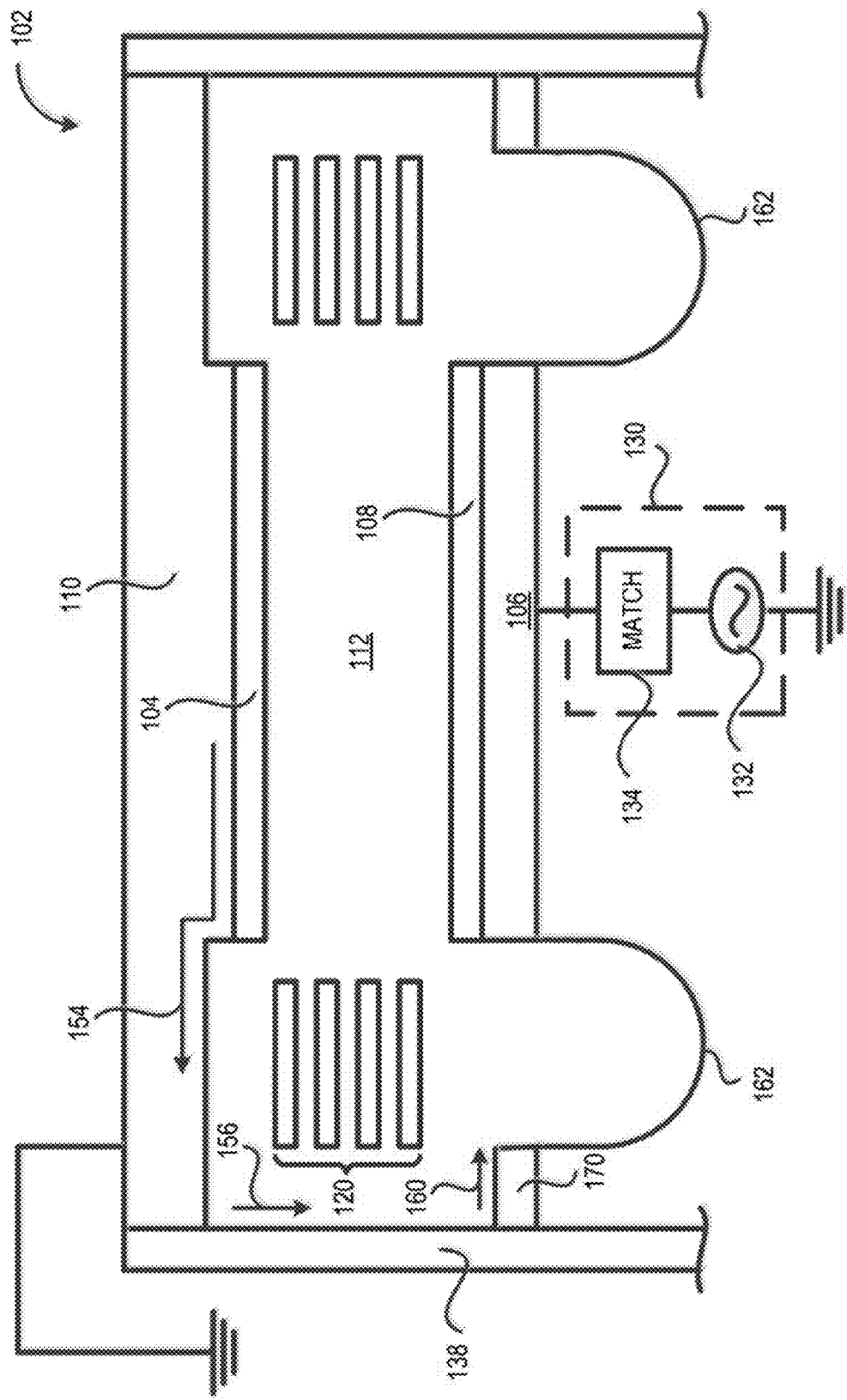
FIG. 1 shows, in accordance with an embodiment of the invention, a cross-sectional drawing of a typical capacitive plasma processing chamber.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various computation and/or control tasks.

In accordance with embodiments of the invention, there are provided sensors that are positioned azimuthally around the chamber in order to monitor the RF current return paths. The monitored parameters pertaining to the RF current return paths may be used to characterize the non-uniformity in the azimuthal direction.

In an embodiment of the invention, chamber sensors are employed with the RF ground straps that connect the lower electrode to other parts of the chamber. For example, in some chambers, the lower electrode may be coupled to ground using a plurality of RF ground straps arranged azimuthally so as to improve RF ground return uniformity in the azimuthal direction. Implementing RF current sensors with the RF ground straps advantageously permits measurement of plasma RF return currents on the RE ground straps. If these RF return currents or RF voltages change over time, the change can also be employed for alarm or process modification purposes, for example.

In addition to implementing RF current sensors with the RF ground straps, RF current sensors may be positioned at various locations in the azimuthal direction to measure the azimuthal uniformity of the RF return currents in one or more of the other chamber components. For example, RF current sensors may be formed in or attached to the upper electrode components that experience RF return currents. These upper electrode components may include, for example, the thermo coupled plate, the liner, or the shroud. RF current sensors may also be employed with any other part of the chamber through which RF return currents traverse.

The features and advantages of the invention may be better understood with reference to the figures and discussions that follow.

FIG. 1 shows, in accordance with an embodiment of the invention, a cross-sectional drawing of a capacitive plasma processing chamber 102. It should be understood that the components of FIG. 1 are only representative and are highly simplified to facilitate discussion. Other components and other designs are possible with respect to both capacitively and inductively-coupled plasma processing systems, and FIG. 1 is not meant to be limiting of the scope of the invention.

Processing chamber 102 (which may represent, for example, a chamber of a cluster tool) includes an upper electrode 104 and a lower electrode assembly 106 on which a wafer 108 is disposed. Lower electrode assembly 106 is an assembly that may include different components and generally implements a substrate holder while being energized by one or more RF power supplies (such as RF power supply 130, which includes RF generator 132 and RF match 134). Upper electrode 104 may be attached to a thermo coupled plate 110 through which various ports may be disposed for the introduction of process gas into the plasma generating region 112 between upper electrode 104 and lower electrode assembly 106 in order to form a plasma in a plasma generating region 112 to process wafer 108.

A plurality of confinement rings 120 is shown to delineate the plasma generating region 112 in which plasma is confined during processing. Upper electrode 104 is typically grounded, although upper electrode 104 may also be coupled with one or more RF power supplies to provide RF energy to the upper electrode if so desired.

During processing, RF current flows in the direction of arrow 154 along the skin of upper electrode 104 and down along arrow 156 along the skin of liner 138 and then along arrow 160 through a plurality of straps 162 to return to RF power supply 130. The plurality of straps 162 are typically disposed around the chamber in the azimuthal direction radiating from the lower electrode in order to improve the azimuthal uniformity of the RF return currents. It should be understood that in a top-down view (viewing from the upper electrode), multiple individual straps 162 would be seen in one or more embodiments. Each strap may radiate from the lower electrode assembly to couple the lower electrode assembly to a chamber component through which the RF current traverses (such as chamber component 170 of FIG. 1).

Due to, for example, the presence of the aforementioned cantilever arm that supports lower electrode assembly 106, there exists non-uniformity with respect to the positioning of the plurality of straps 162 in the azimuthal direction around lower electrode assembly 106. Consequently, azimuthal non-uniformity exists with respect to the RF return currents around the chamber. Azimuthal non-uniformity may exist due to the presence of other components as well.

In accordance of an embodiment of the invention, an RF ground strap may be fitted with an RF current sensor that is in a form of a non-linear substantially enclosed path in order to permit measurement of the RF return current through the strap. Preferably, each of the plurality of straps 162 (many of which are disposed around the periphery of lower electrode assembly 106) is provided with an RF current sensor although it is also possible to have fewer RF current sensors than the number of straps 162 if desired. These sensors are discussed herein, for example with reference to FIG. 2. As long as there are enough RF current sensors distributed around the periphery of lower electrode assembly 106 (e.g., in the azimuthal direction around a central chamber axis) to measure the various RF return currents in these straps, it is possible to monitor the azimuthal non-uniformity during development and processing. For example, when a plasma is ignited in the plasma processing chamber, the RF return currents are sensed in the plurality of non-linear substantially-enclosed RF current sensors and analyzed to ascertain whether RF return current azimuthal uniformity is acceptable. If RF return currents are found to be non-uniform in the various RF current sensors, strategies may be developed to address the non-uniformity. Such strategies may involve deploying additional or fewer straps or changing chamber parts or chamber geometry to better achieve RF return current azimuthal uniformity, for example.

Figure 2:
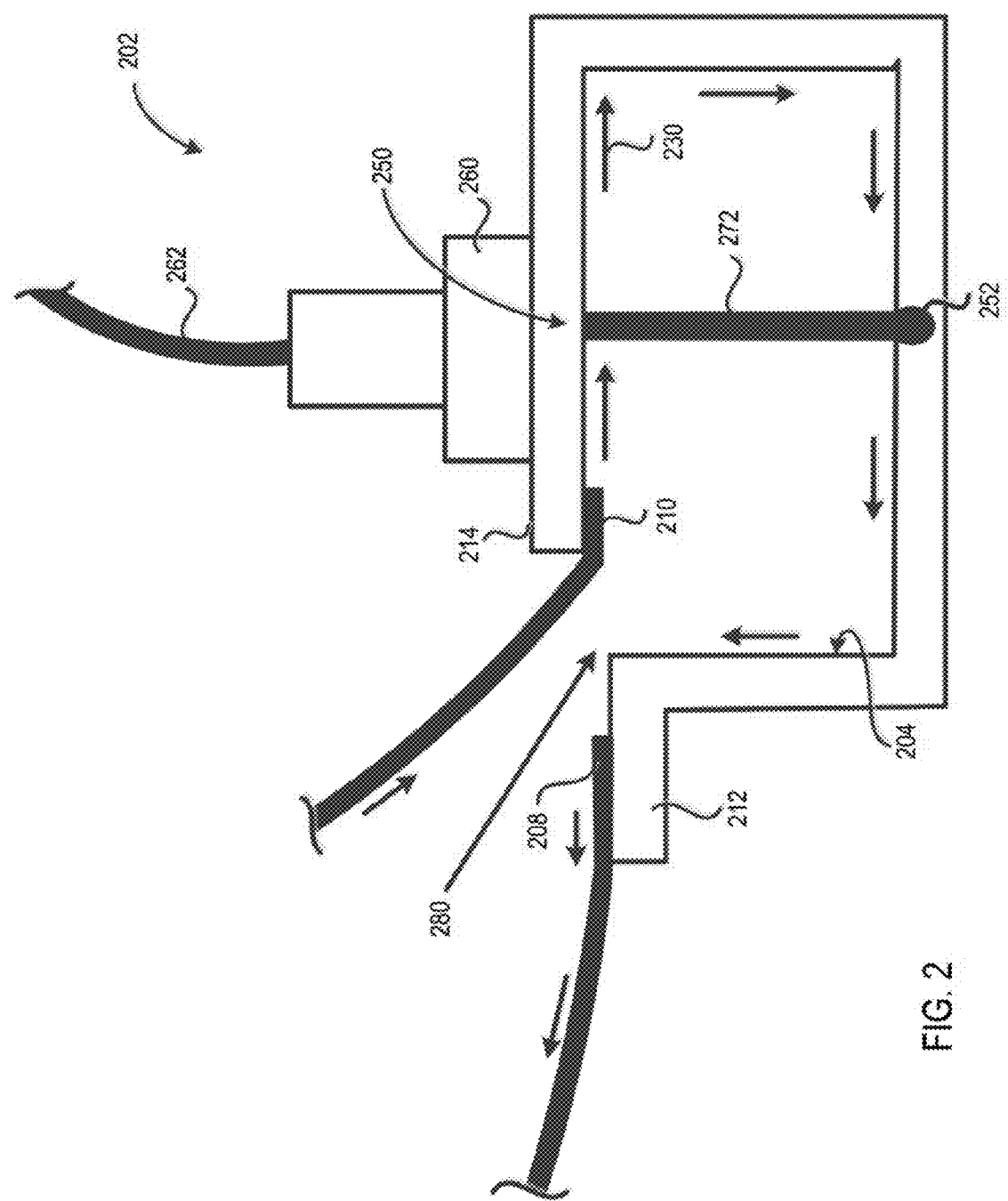
FIG. 2 shows, in accordance with an embodiment of the invention, an example of an RF current sensor.

FIG. 2 shows an example of a discrete RF current sensor 202, which is formed of, in this example, beryllium copper or another suitable highly conductive material. Highly conductive material is preferred since at a high frequency and/or a high power range, a low conductivity material may generate excessive heat and disadvantageously affect the RF return current. As shown, the RF current sensor is a non-linear substantially enclosed (NLSE) sensor that includes non-linear substantially enclosed path that substantially reduces the amount of polymer deposition on inner surface 204. In the context of the present invention, the sensors are said to be substantially enclosed since the two ends of the sensors (see FIG. 2) do not make electrical contact. Instead, there is a gap (280 of FIG. 2), which is preferably kept as small as possible to prevent unwanted polymer deposition to be made inside the sensor.

RF ground straps 162 of FIG. 1 are broken and the two ends 208 and 210 are connected to the two ends 212 and 214 of RF current sensor 202. Current traverses in the direction of arrow 230 along the inner surface of RF current sensor 202. The impedance along the path of current flow between locations 250 and 252 creates a voltage drop, which could be measured by an appropriate voltage measurement device. This voltage may then be employed to monitor the RF return current.

In the example of FIG. 2, a connector 260 is provided such that the core 272 of coaxial cable 262 picks up the voltage potential at position 252 and the sheath of coaxial cable 262 (not shown) picks up the voltage potential at around position 250. The use of a co-axial cable is not required, however, and any suitable conductors may be employed. As such, the voltage drop between position 250 and position 252 may be detected. The voltage drop is proportional to the current in accordance with Equation 1 below.

$$V(t) = L(dI/dt) = \omega L I_0 \sin(\omega t + \phi \pi/2)$$ Equation 1 wherein $\phi$ represents the phase. The inductance L may be characterized in advance for each individual sensor. Generally speaking, the inductance may be derived from measurements using a network analyzer or an inductance analyzer, for example. In some embodiments, the inductance may be in the range of roughly 1 nH, for example.

The voltage drop across positions 250 and 252 in the RF current return path is then monitored for each sensor. Since the RF current sensor is substantially enclosed such that the current path that generates the voltage difference between locations 250 and 252 is protected from polymer deposition due to the narrowness of opening 280, the RF current path between locations 250 and 252 is substantially immune to deposition and the sensor can thus be highly robust. In one or more embodiments, the two open sides (the sides disposed on imaginary side planes that are normal to vectors pointing out of the page and into the page in the side view of FIG. 2) may be enclosed with side enclosures formed of a suitable insulating material to prevent unwanted deposition material from entering into the interior cavity of the sensor. For example, flat side enclosures may be glued or fitted or pressed or fastened or attached to or even formed integrally with the edges of the open sides of the sensor to prevent unwanted deposition material from entering into the interior cavity of the sensor. Consequently, robust and direct measurement of the RF return current may be accomplished by monitoring the voltage difference between locations 250 and 252.

The sensor of FIG. 2 can accommodate a wide range of RF power and has a signal-to-noise ratio above 40 dB, which renders it highly suitable for use in plasma processing chambers that employ high RF power and/or are characterized by a relatively noisy environment. By calibrating and monitoring the voltage differences between locations 250 and 252 for the various RF current sensors (disposed with various RF ground straps around the lower electrode in the azimuthal direction around the cylindrical chamber central axis), it is possible to monitor the changes in the RF return currents in the azimuthal direction in various RF ground straps. Data pertaining to these monitored changes may be employed to develop strategy during development to improve the azimuthal uniformity of the RF return currents.

For example, one or more dummy parts may be installed to counteract the non-uniformity introduced by the presence of a needed component. Data pertaining to the monitored changes may also be employed to affect processing controls and/or to trigger alarms during plasma processing if the monitored value of the voltage between locations 250 and 252 of any given sensor strays above or below a predefined threshold.

In an embodiment, the sensor of FIG. 2 is a separate part although it is also possible to form the sensor out of the strap by creating a bend in the strap to form a non-linear substantially enclosed path. The non-linear substantially enclosed path substantially shields the RF current path (traversing along the inner skin between locations 250 and 252 in the example of FIG. 2) from polymer deposition or deposition by other materials. Generally speaking, however, if the strap is thin and deformable, it is preferable to form the RF current sensor from a component that is thicker (i.e., have a greater sidewall thickness than the thickness of the strap) and/or mechanically more robust to ensure that the measurement values are substantially constant throughout the life of the sensor and to ensure that the narrowness of opening 280 is maintained to prevent polymer deposition from affecting the sensor.

Figure 3A:
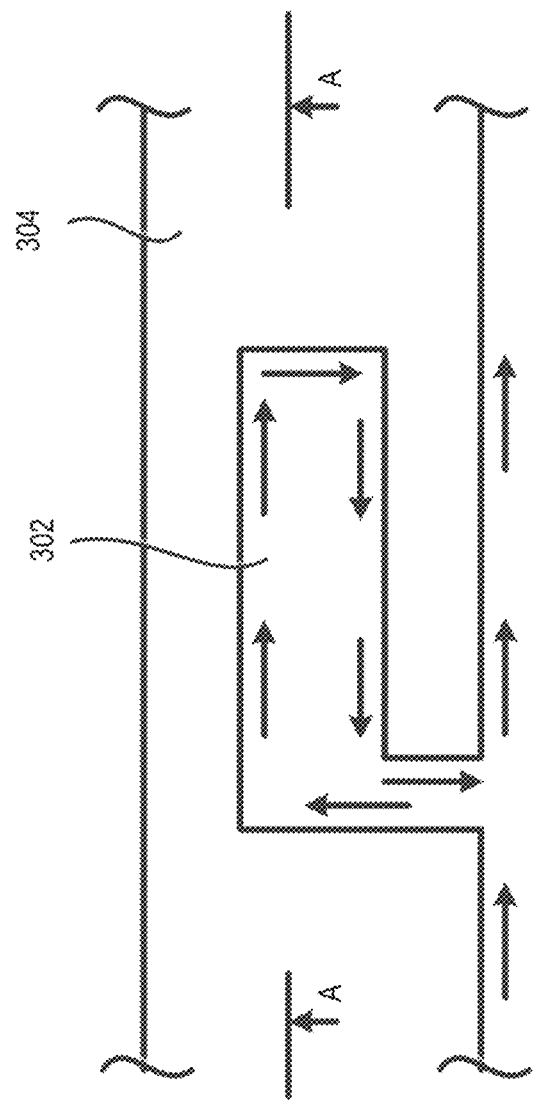
FIG. 3A shows, in accordance with an embodiment of the invention, a trench machined from a horizontal chamber component to serve as an RF current sensor for sensing azimuthal non-uniformity.
Figure 3B:
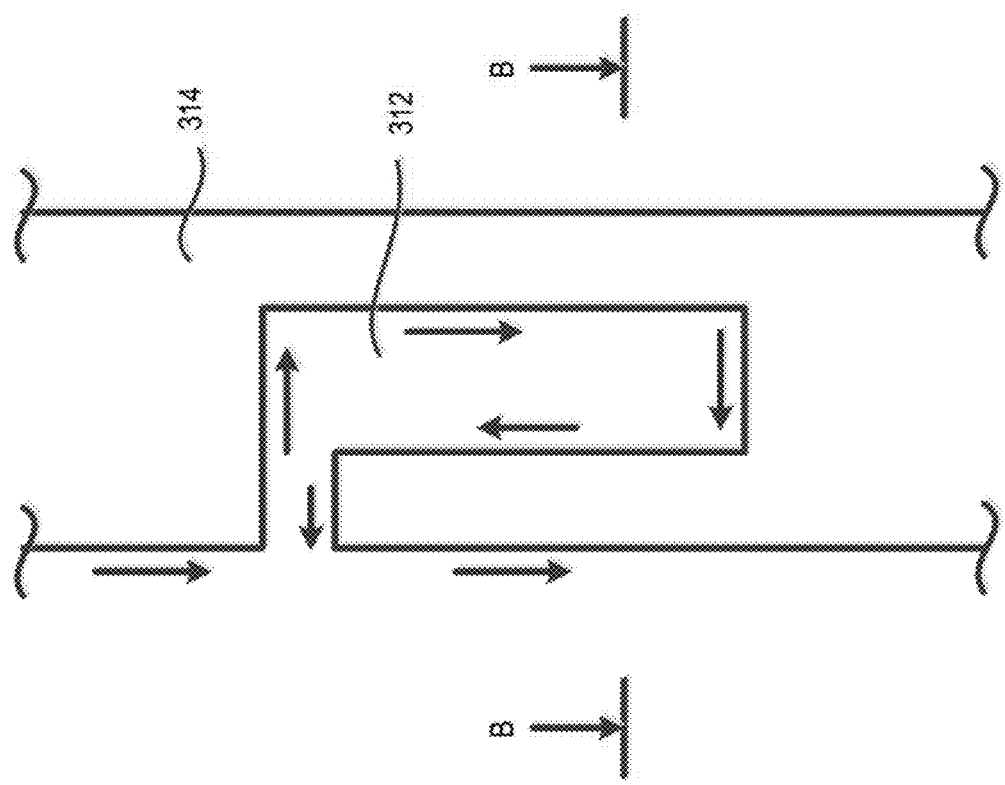
FIG. 3B shows, in accordance with an embodiment of the invention, a trench machined from a vertical chamber component to serve as an RF current sensor for sensing azimuthal non-uniformity.

The RF sensor may also be disposed along any RF return path to monitor the RF current. In an advantageous embodiment, a trench (or pocket) may be machined from the thermo coupled plate 110 of FIG. 1 to create a non-linear substantially enclosed path. An example of such a pocket or trench 302 (FIG. 3A) is shown machined from, for example, a horizontal upper electrode assembly component 304 (such as from the thermo coupled plate). An example of such a pocket or trench 312 (FIG. 3B) is shown machined from, for example, a chamber liner 314. RF current would traverse along the inner surface of such trench/pocket.

Since the trench/pocket has an impedance value, there exists a voltage drop as current traverses the trench/pocket. This voltage drop may then be monitored. Multiple such trenches or pockets may be formed and distributed uniformly in the azimuthal direction around a chamber central axis (i.e., the axis located at the center of the cylindrical chamber) in the thermocoupled plate in order to monitor the various RF currents for azimuthal uniformity.

Such trenches or pockets may also be formed in the liner or in the lower electrode assembly 106 that is in the RF current return paths. These trenches or pockets may be distributed in the azimuthal direction, for example. By calibrating each trench sensor or pocket sensor in advance and accounting for the variance in the sensor parameters due to manufacturing tolerance, it is possible to characterize the RF return current at each sensor. For example, by calibrating and monitoring the voltages associated with the various RF current sensors, it is possible to monitor the changes in the RF return currents in the azimuthal direction.

As mentioned, data pertaining to these monitored changes may be employed to develop strategies during development to improve the azimuthal uniformity of the RF return currents. Data pertaining to the monitored changes may also be employed to affect processing controls and/or to trigger alarms during plasma processing if the monitored value of the voltage output by any given sensor strays above or below a predefined threshold.

FIG. 4A shows, in accordance with an embodiment of the invention, a plurality of RF sensor trenches 402-416 machined or disposed in a horizontal chamber component (such as the aforementioned thermo coupled plate or another horizontal chamber part having RF current traversing it). Eight sensors are shown although a larger or smaller number of sensors may be employed.

FIG. 4B shows, in accordance with an embodiment of the invention, a plurality of RF sensor trenches 420-434 machined from, for example, a chamber liner 314. Eight sensors are shown although a larger or smaller number of sensors may be employed. Each sensor may be coupled to a pair of conductors (which may be the sheath and core of a co-axial cable or other conductor form factors) to permit voltage measurement in the manner discussed in connection with FIG. 2, for example. The view of FIG. 4B is in accordance with view B-B (see FIG. 3B).

FIG. 4C shows, in accordance with an embodiment of the invention, a trench 436 machined or disposed in a horizontal chamber component (such as the aforementioned thermo coupled plate or another horizontal chamber part having RF current traversing it where multiple RF sensors can be placed. RF current would traverse along the inner surface of such trench.

FIG. 4D shows, in accordance with an embodiment of the invention, a trench 438 machined from, for example, a chamber liner 314 where multiple RF sensors can be placed. RF current would traverse along the inner surface of such trench.

Although the RF current sensors of FIG. 2 are preferred, other sensors may also be employed. For example, B-dot loop probe(s) may be employed to measure the RF return current(s) in the lower electrode assembly RF enclosure. As another example, Rogowski coils may also be employed around the RF ground straps to measure the RF return currents. Each sensor may be coupled to a pair of conductors (which may be the sheath and core of a co-axial cable or other conductor form factors) to permit voltage measurement in the manner discussed in connection with FIG. 2, for example.

As can be appreciated from the foregoing, embodiments of the invention permit the characterization and monitoring of the RF return currents in the azimuthal direction so that strategies can be developed to improve azimuthal uniformity of the process result. The use of the sensors in the manner discussed simplifies chamber retrofitting since if the sensors are employed with the RF straps, these sensors can be easily retrofitted into the existing straps. Alternatively, new sensor-equipped RF straps may simply be employed to replace existing RF straps. As another example, chamber parts may be removed for machining the discussed trenches/pockets to endow the plasma processing chamber with the azimuthal uniformity monitoring capability. Because the sensors are substantially immune from polymer deposition, the sensors are highly accurate and reliable even over many processing cycles.

While this invention has been described in terms of several preferred embodiments, there are alterations, permutations, and equivalents, which fall within the scope of this invention. For example, although a capacitively coupled plasma processing system is discussed in the examples, embodiments of the invention would also work with other types of plasma processing systems, such as inductively coupled, ECR, microwave, etc. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system having a plasma processing chamber, including a lower electrode assembly, comprising:
    a plurality of RF straps to permit RF currents to traverse said plurality of RF straps;
    a plurality of sensors, each of said plurality of sensors being coupled with one of said plurality of straps, and each of said plurality of sensors has a first end and a second end separated by a gap to provide coupling with said one of said plurality of straps, wherein each sensor represents a non-linear substantially enclosed RF sensor;
    wherein said non-linear substantially enclosed RF sensor is coupled to a co-axial cable, a sheath of said co-axial cable is coupled to a first portion of said non-linear substantially enclosed RF sensor and a core of said co-axial cable is coupled to a second portion of said non-linear substantially enclosed RF sensor to acquire voltage measurements between said first portion and said second portion.

2. The plasma processing system of claim 1 wherein said non-linear substantially enclosed RF sensor is formed of beryllium copper.

3. The plasma processing system of claim 1 wherein said non-linear substantially enclosed RF sensor is a part having a greater sidewall thickness than a thickness of a RF strap to which said non-linear substantially enclosed RF sensor is coupled,
    wherein each of said straps is a broken strap having a respective first end and second end of the sensor coupled to ends of said broken strap.

4. The plasma processing system of claim 1 wherein said non-linear substantially enclosed RF sensor further includes insulating side enclosures to enclose side planes of said non-linear substantially enclosed RF sensor.

5. The plasma processing system of claim 1 wherein each of said straps is a broken strap having a respective first end and second end of the sensor coupled to ends of said broken strap.

6. A chamber for processing a substrate, comprising,
    an upper electrode;
    a lower electrode;
    a plurality of RF straps coupled around the lower electrode, each strap coupled between the lower electrode and a chamber component that provides an RF return to RF power provided to the chamber, wherein at least one of the plurality of RF straps is broken into a first strap and a second strap;
    a sensor disposed between the first strap and the second strap;
    the first strap has a first end connected to the lower electrode and the second strap has a first end connected to the chamber component;
    the sensor has a first end connected to a second end of the first strap,
    the sensor has a second end connected to a second of the second strap;
    wherein the sensor is a non-linear substantially enclosed RF sensor and is coupled to a co-axial cable,
        a sheath of said co-axial cable is coupled to a first portion of said non-linear substantially enclosed RF sensor, and
        a core of said co-axial cable is coupled to a second portion of said non-linear substantially enclosed RF sensor to acquire voltage measurements between said first portion and said second portion.

7. The chamber of claim 5, wherein a gap is defined between the first end and the second end of the sensor.

8. The chamber of claim 5, wherein said non-linear substantially enclosed RF sensor is formed of beryllium copper.

9. The chamber of claim 5, wherein said non-linear substantially enclosed RF sensor is a part having a greater sidewall thickness than a thickness of said RF strap to which said non-linear substantially enclosed RF sensor is coupled.

10. The chamber of claim 5, wherein said non-linear substantially enclosed RF sensor further includes insulating side enclosures to enclose side planes of said non-linear substantially enclosed RF sensor.

* * * * *